United States Patent
Yoshii et al.

(10) Patent No.: US 9,324,591 B2
(45) Date of Patent: Apr. 26, 2016

(54) HEAT TREATMENT APPARATUS AND HEAT TREATMENT METHOD

(75) Inventors: Koji Yoshii, Oshu (JP); Tatsuya Yamaguchi, Sapporo (JP); Wenling Wang, Oshu (JP); Takanori Saito, Oshu (JP)

(73) Assignee: Tokyo Electron Limited, Minato-Ku (JP)

( * ) Notice: Subject to any disclaimer, the term of this patent is extended or adjusted under 35 U.S.C. 154(b) by 977 days.

(21) Appl. No.: 13/438,234

(22) Filed: Apr. 3, 2012

(65) Prior Publication Data

US 2012/0258415 A1 Oct. 11, 2012

(30) Foreign Application Priority Data

Apr. 5, 2011 (JP) ................. 2011-083637

(51) Int. Cl.
*F27D 21/00* (2006.01)
*H01L 21/67* (2006.01)

(52) U.S. Cl.
CPC .... H01L 21/67109 (2013.01); H01L 21/67248 (2013.01)

(58) Field of Classification Search
USPC ....................................................... 432/9, 32
See application file for complete search history.

(56) References Cited

U.S. PATENT DOCUMENTS

| | | | |
|---|---|---|---|
| 7,135,659 B2 | 11/2006 | Ejima | |
| 2004/0226933 A1* | 11/2004 | Wang | H01L 21/324 219/390 |
| 2005/0225937 A1* | 10/2005 | Saito et al. | 361/688 |
| 2006/0188240 A1* | 8/2006 | Tanaka et al. | 392/416 |
| 2008/0008566 A1 | 1/2008 | Endo et al. | |
| 2008/0046111 A1 | 2/2008 | Kataoka et al. | |
| 2009/0078197 A1* | 3/2009 | Takenaga et al. | 118/708 |
| 2009/0095422 A1* | 4/2009 | Sugishita | C23C 16/4411 156/345.27 |
| 2009/0191718 A1* | 7/2009 | Nakashima et al. | 438/758 |

(Continued)

FOREIGN PATENT DOCUMENTS

| | | |
|---|---|---|
| JP | 03-145121 A1 | 6/1991 |
| JP | 07-273057 A1 | 10/1995 |

(Continued)

OTHER PUBLICATIONS

Japanese Office Action (Application No. 2011-083637) dated Jul. 18, 2014.

(Continued)

*Primary Examiner* — Alissa Tompkins
*Assistant Examiner* — Nathaniel Herzfeld
(74) *Attorney, Agent, or Firm* — Burr & Brown, PLLC

(57) ABSTRACT

A heat treatment apparatus including: a processing container for processing wafers held in a boat; heaters for heating the processing container; and a control section for controlling the heaters. Heater temperature sensors are provided between the heaters and the processing container, in-container temperature sensors are provided in the processing container, and movable temperature sensors are provided in the boat. The temperature sensors are connected to a temperature estimation section. The temperature estimation section selects two of the three types of temperature sensors, e.g. the movable temperature sensors and the in-container temperature sensors, and determines the temperature of a wafer according to the following formula: $T = T1 \times (1-\alpha) + T2 \times \alpha$, $\alpha > 1$, where T1 and T2 represent detection temperatures of the selected temperature sensors, and $\alpha$ represents a mixing ratio.

2 Claims, 3 Drawing Sheets

(56) References Cited

U.S. PATENT DOCUMENTS

2009/0311807 A1* 12/2009 Yamaga et al. .................. 438/5
2011/0008742 A1 1/2011 Katsumata

FOREIGN PATENT DOCUMENTS

| | | |
|---|---|---|
| JP | 09-007965 A1 | 1/1997 |
| JP | 2002-353153 A1 | 12/2002 |
| TW | 200822218 A | 5/2008 |
| TW | 200830409 A | 7/2008 |
| TW | 200936974 A | 9/2009 |

OTHER PUBLICATIONS

Taiwanese Office Action, Taiwanese Application No. 101110394, dated Mar. 10, 2015 (4 pages).

* cited by examiner

HEAT TREATMENT APPARATUS AND HEAT TREATMENT METHOD

CROSS-REFERENCE TO RELATED APPLICATION

This application claims the priority benefit of Japanese Patent Application No. 2011-083637, filed on Apr. 5, 2011, the disclosure of which is incorporated herein by reference in its entirety.

BACKGROUND OF THE INVENTION

1. Field of the Invention

The present invention relates to a heat treatment apparatus and a heat treatment method for heat treating an object to be processed.

2. Description of Related Art

In the manufacturing of semiconductor devices, various types of heat treatment apparatuses are used to perform heat treatments, such as oxidation, diffusion, CVD, annealing, etc. of objects to be processed, such as semiconductor wafers. Among them, a batch-type heat treatment apparatus, in particular of the vertical type, is known which is capable of heat treating a large number of semiconductor wafers (hereinafter sometimes referred to simply as wafers) at a time. Such a vertical heat treatment apparatus comprises a heat treatment furnace including a processing container having a bottom opening. A holder, loaded with a large number of wafers, is carried (loaded) into the processing container from below, and the wafers in the processing container are heat treated by means of a heating section (heater) provided around the processing container. The heat treatment apparatus is generally provided with a temperature sensor for detecting the temperature of the heater, and a temperature sensor for detecting the interior temperature of the processing container. Based on a signal from each of the temperature sensors, the power of the heater is controlled so that a wafer(s) or the interior of the processing container reaches a set temperature. In this connection, patent document 2 discloses a method in which a follow-up temperature is controlled by interpolating a detection value from a temperature sensor and a set value at a certain ratio in a mixing ratio adjustment section. Patent document 1 teaches provision of a temperature sensor which lies in the vicinity of a wafer and which moves along with the wafer.

PRIOR ART DOCUMENTS

Patent document 1: Japanese Patent Laid-Open Publication No. H7-273057
Patent document 2: Japanese Patent Laid-Open Publication No. 2002-353153

SUMMARY OF THE INVENTION

Nowadays, with an increasing demand for lower processing temperatures (100 to 400° C.) associated with microminiaturization of semiconductor devices, it is becoming increasingly difficult to control the temperature of a semiconductor wafer.

During the period from loading of a holding tool, housing a semiconductor wafer, into a processing container until stabilization of the temperature of the wafer at a set temperature, a detection temperature of a temperature sensor differs greatly from the actual temperature of the wafer especially in the temperature range of 100 to 400° C. The large temperature difference is due to the absorption wavelength of the wafer. Furthermore, it takes a long time to heat the wafer up to the set temperature.

The present invention has been made in view of the above situation. It is therefore an object of the present invention to provide a heat treatment apparatus and a heat treatment method which can heat an object to be processed up to a set temperature quickly and accurately.

In order to achieve the object, the present invention provides a heat treatment apparatus comprising: a processing container for processing an object to be processed; a heating section, provided outside the processing container, for externally heating the processing container; a holding section for holding the object to be processed and to be carried into and out of the processing container; a holding section transport section for carrying the holding section into and out of the processing container; a first temperature sensor, provided between the heating section and the processing container, for detecting the temperature of the heating section; a second temperature sensor, fixed in the processing container, for detecting the interior temperature of the processing container; a third temperature sensor to be carried into and out of the processing container along with the holding section; a control section for controlling a power to the heating section; and a temperature estimation section for selecting two of the first temperature sensor, the second temperature sensor and the third temperature sensor, and estimating the temperature of the object to be processed based on detection temperatures from the two temperature sensors.

In a preferred embodiment of the heat treatment apparatus of the present invention, the temperature estimation section determines the temperature T of the object to be processed according to the following formula: $T=T1\times(1-\alpha) + T2\times\alpha$, $\alpha > 1$, where $T1$ represents a detection temperature of one of the first temperature sensor, the second temperature sensor and the third temperature sensor, $T2$ represents a detection temperature of another one of the first temperature sensor, the second temperature sensor and the third temperature sensor, and $\alpha$ represents a mixing ratio.

The present invention also provides a heat treatment method using the heat treatment apparatus comprising: a processing container configured to process an object to be processed; a heating section, provided outside the processing container, configured to externally heat the processing container; a holding section configured to hold the object to be processed and to be carried into and out of the processing container; a holding section transport section configured to carry the holding section into and out of the processing container; a first temperature sensor, provided between the heating section and the processing container, configured to detect the temperature of the heating section; a second temperature sensor, fixed in the processing container, configured to detect the interior temperature of the processing container; a third temperature sensor to be carried into and out of the processing container along with the holding section; a control section for controlling a power to the heating section; and a temperature estimation section configured to select two of the first temperature sensor, the second temperature sensor and the third temperature sensor, and estimate the temperature of the object to be processed based on detection temperatures from the two temperature sensors, said method comprising the steps of: loading an object to be processed into the holding section; carrying the object to be processed, held in the holding section, into the processing container; selecting in the temperature estimation section two of the first temperature sensor, the second temperature sensor and the third temperature sensor, and estimating the temperature of the object to be processed based on detection temperatures from the two temperature sensors; and controlling the power of the heating section based on the temperature of the object to be processed, estimated by the temperature estimation section.

In a preferred embodiment of the heat treatment method of the present invention, the temperature estimation section determines the temperature T of the object to be processed according to the following formula: $T=T1\times(1-\alpha) +T2\times\alpha$, $\alpha>1$, where T1 represents a detection temperature of one of the first temperature sensor, the second temperature sensor and the third temperature sensor, T2 represents a detection temperature of another one of the first temperature sensor, the second temperature sensor and the third temperature sensor, and $\alpha$ represents a mixing ratio.

In a preferred embodiment of the present invention, the heat treatment method further comprises the step of selecting the two temperature sensors and determining the mixing ratio $\alpha$ by comparing detection temperature data from the first temperature sensor, the second temperature sensor and the third temperature sensor with a detection temperature of the object to be processed after the step of carrying the object to be processed, held in the holding section, into the processing container, and determining a combination of the temperature sensors whose detection temperatures are closer to the detection temperature of the object to be processed than the detection temperature of the non-selected temperature sensor.

The present invention makes it possible to accurately estimate the temperature of an object to be processed, appropriately control the power of the heating section and quickly and accurately increase and control the temperature of the object to be processed even in a low temperature range in which the absorption wavelength of the object to be processed is short and the thermal response of the object to be processed is low and in which a temperature sensor, because of its higher thermal response than the object to be processed, cannot follow up the temperature of the object to be processed.

DETAILED DESCRIPTION OF THE INVENTION

Preferred embodiments of the present invention will now be described with reference to the drawings.

Figure 1:
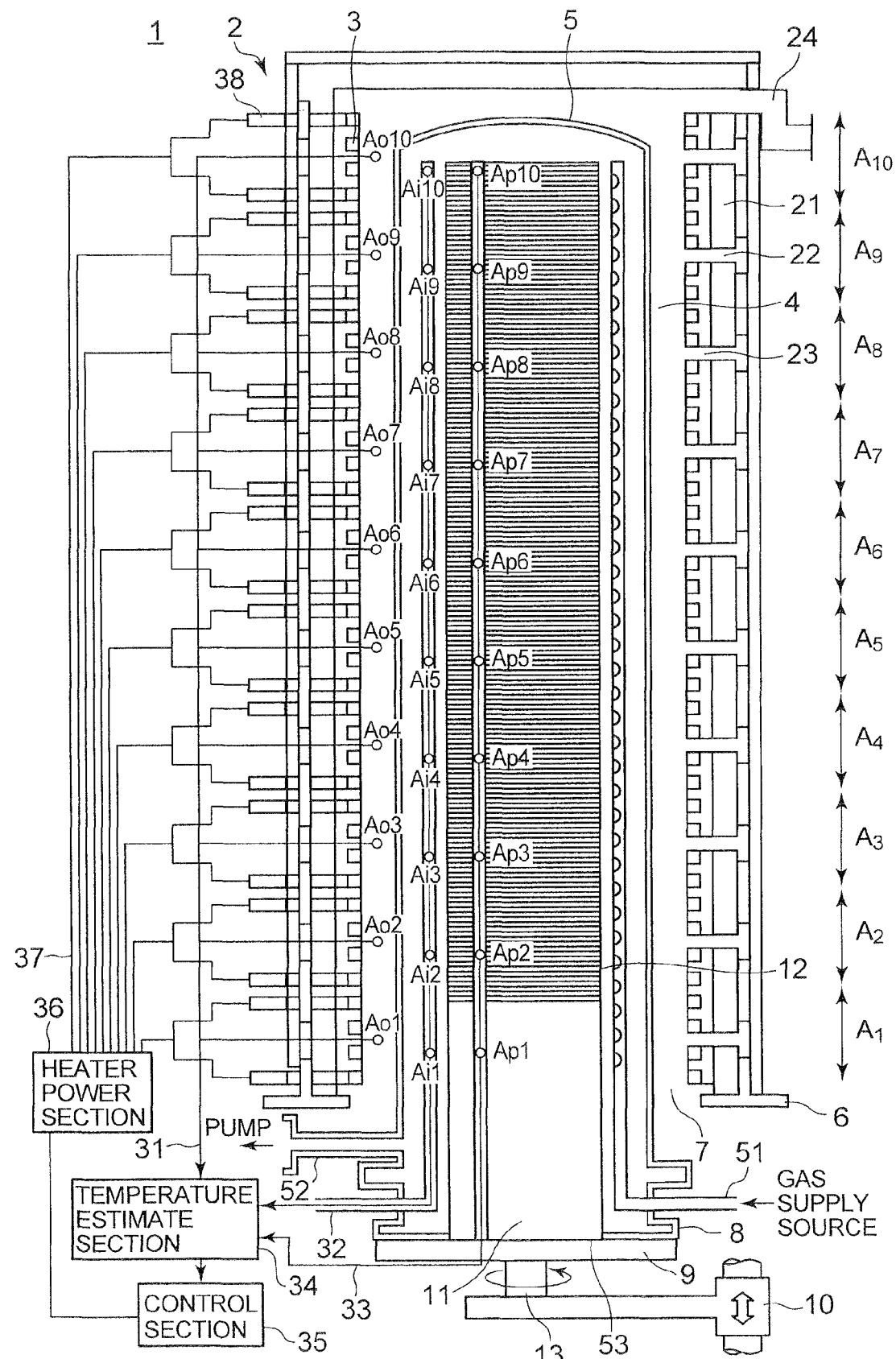
FIG. 1 is a vertical sectional view schematically showing a heat treatment apparatus according to an embodiment of the present invention.
Figure 2:
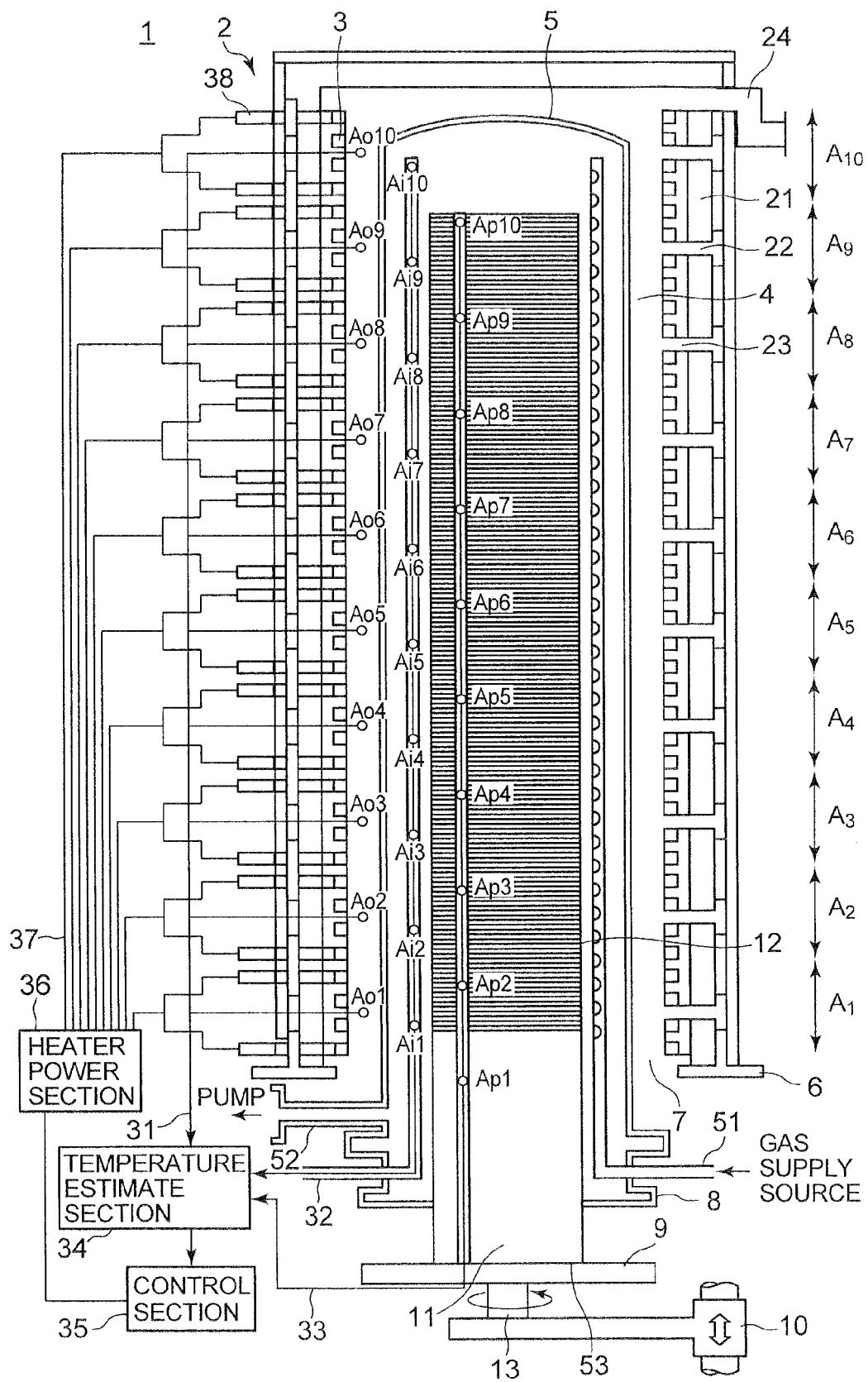
FIG. 2 is a diagram corresponding to FIG. 1, showing the heat treatment apparatus upon loading of objects to be processed.

Referring to FIG. 1, a vertical heat treatment apparatus 1 includes a vertical heat treatment furnace 2 which can house a large number of objects to be processed (e.g. semiconductor wafers W) and perform heat treatment, such as oxidation, diffusion or reduced-pressure CVD, of the object to be processed. The heat treatment furnace 2 includes, in its inner circumferential surface, heat generating resistors (heaters) 3, and includes a processing container 5 for housing and heat treating the wafers W. The processing container 5 defines a space 4 between the processing container 5 and the heaters 3. The heaters 3 function as a heating section for heating the wafers W.

The space 4 is divided into a plurality of unit areas arranged in the vertical direction, for example, 10 unit areas A1, A2, A3, A4, A5, A6, A7, A8, A9, A10. The heaters 3 are configured to be capable of individually controlling their powers for each of the 10 unit areas A1 to A10. Heater temperature sensors (first temperature sensors) Ao1 to Ao10 for measuring the temperatures of the heaters in the unit areas A1 to A10, respectively, are provided in the space 4.

The heat treatment furnace 2 is supported on a base plate 6 which has an opening 7 for inserting the processing container 5 from below.

The processing container 5 is supported on the base plate 6 via a manifold 8. A processing gas is supplied from the manifold 8 into the processing container 5 through an injector 51 which is connected to a not-shown gas supply source. A processing gas or a purge gas, supplied into the processing container 5, is exhausted through an exhaust port 52 which is connected to a not-shown evacuation system including a vacuum pump capable of controllably depressurizing the processing container 5.

Below the manifold 8 is provided a lid 9 for closing a furnace opening 53 and which can be moved vertically by means of a lifting mechanism 10. A heat-retaining section 11 is placed on the upper surface of the lid 9, and a holding section (boat) 12 for holding a large number of wafers W at a predetermined spacing in the vertical direction, is provided on the heat-retaining section 11. The boat 12 is carried (unloaded) from the processing container 5 into a not-shown loading area by the downward movement of the lid 9 by means of the lifting mechanism 10 and, after replacement of wafers W, carried (loaded) into the processing container 5 by the upward movement of the lid 9 by means of the lifting mechanism 10.

The lid 9 is provided with a rotating mechanism 13 for rotating the boat 12 on its axis.

The heat treatment furnace 2 may be provided with a heat insulator 21, flow passages 22 for a cooling gas for rapidly cooling the processing container 5, gas outlets 23 for ejecting the cooling gas from the flow passages 22 into the space 4, and an exhaust port 24 for exhausting the cooling gas from the space 4. A not-shown heat exchanger and a not-shown blower may be provided downstream of the exhaust port 24. Further, a not-shown blower for supplying the cooling gas to the flow passages 22 may also be provided.

The processing container 5 is provided with in-container temperature sensors (second temperature sensors) Ai1 to Ai10 for detecting the interior temperatures of the processing container 5 at positions corresponding to the unit areas A1 to A10, respectively.

Further, the boat 12 is provided with movable temperature sensors (third temperature sensors) Ap1 to Ap10 which are to be loaded/unloaded along with wafers W.

In conventional practice, a signal is introduced into a control section 35 through detection signal lines 31, 32 from the heater temperature sensors Ao1 to Ao10 and the in-container temperature sensors Ai1 to Ai10. The results of calculation for PID control or model control, performed in the control section 35, are sent to a heater power section 36. The heater power section 36 controls the power of each heater 3 via a heater power line 37 and a heater terminal 38.

The conventional method, however, cannot fully follow a change in the temperature of a wafer W in a low temperature range of 100 to 400° C. According to the present invention, a temperature estimation section 34 obtains data on detection temperatures of the movable temperature sensors Ap1 to Ap10 through a detection signal line 33, and also obtains data on detection temperatures of the heater temperature sensors Ao1 to Ao10 and the in-container temperature sensors Ai1 to Ai10 through the detection signal lines 31 and 32, respectively. The temperature estimation section 34 makes a calculation according to the below-described formula to estimate a change in the temperature of a wafer W before and after the wafer W is loaded from the loading area into the processing container 5. The results of the estimation are sent to the control section 35, and the control section 35 controls the power of each heater 3.

The operation of the temperature estimation section 34 upon loading of wafers W will now be described with reference to FIG. 3.

Figure 3:
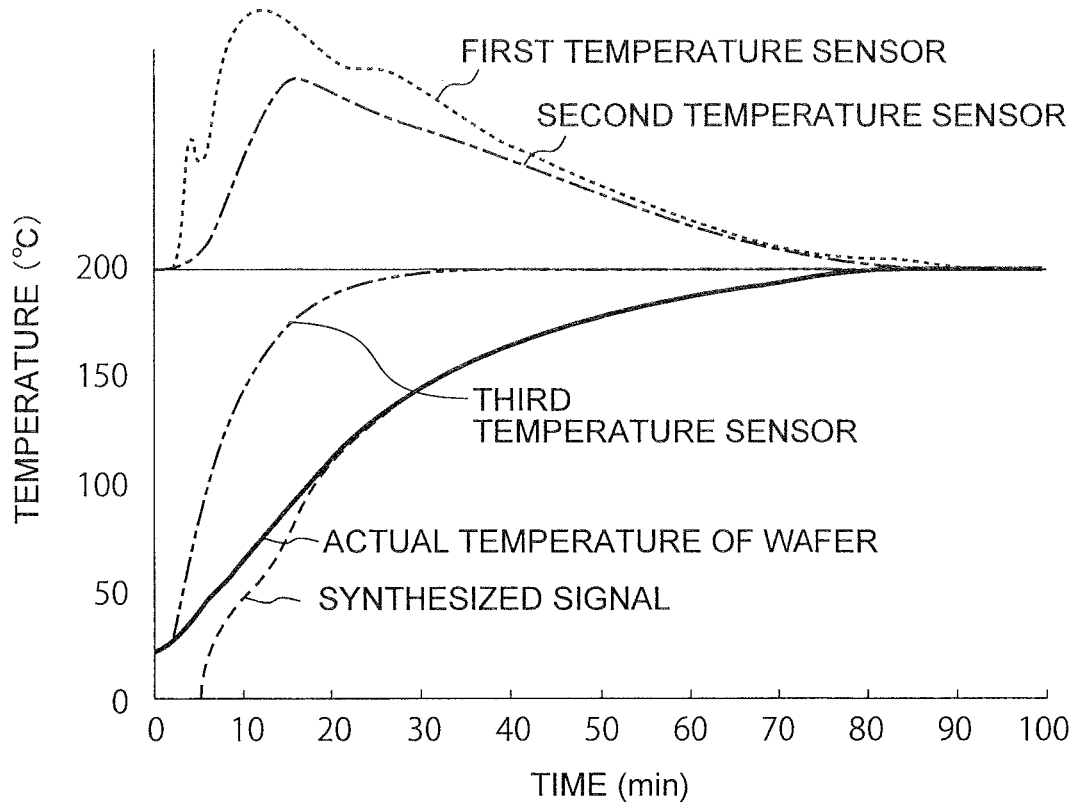
FIG. 3 is a diagram illustrating the action of a temperature estimation section.

FIG. 3 is a graphical diagram illustrating the action of the temperature estimation section 34, the abscissa representing time (min) upon loading of a wafer W, and the ordinate representing temperature.

The graphs show the behaviors of the temperatures detected by a heater temperature sensor (first temperature sensor), an in-container temperature sensor (second temperature sensor) and a movable temperature sensor (third temperature sensor), as observed during the period from the time when the boat at room temperature is loaded into the processing container at a stable interior temperature of 200° C. until the time when the temperature of a wafer W stabilizes at 200° C. As can be seen in FIG. 3, the behaviors of the detection temperatures of the first to third temperature sensors are all quite different from the behavior of the actual temperature of the wafer. Further, the detection temperatures of the sensors are all higher than the actual temperature of the wafer W. As will be appreciated from the data, it is difficult to estimate the temperature of the wafer W at a mixing ratio of 0 to 100% by the conventional method.

The temperature estimation section 34 calculates a synthesized signal according to the following calculation formula:

$$T = T1 \times (1-\alpha) + T2 \times \alpha, \alpha > 1,$$

where T1 represents a detection temperature of one of the first temperature sensor, the second temperature sensor and the third temperature sensor, T2 represents a detection temperature of another one of the first temperature sensor, the second temperature sensor and the third temperature sensor, and α represents a mixing ratio.

In the case of an exemplary synthesized signal, calculated by using the movable sensor for T1, the in-container temperature sensor for T2 and "1.8" for α, the behavior of the synthesized signal synchronizes well with the behavior of the temperature of a wafer. The selection of a temperature sensor is affected by the position of the sensor in the apparatus. Further, the construction of a temperature sensor depends on the construction of the apparatus. It is therefore necessary to prepare temperature data such as the one shown in FIG. 3 and find out an optimum value in advance.

As shown in FIG. 3, it takes a very long time, e.g. 90 minutes, to stabilize the temperature of a wafer at 200° C. after loading the wafer into the processing container. It has turned out that the time taken for the stabilization of the temperature of a wafer upon its loading can be shortened by 30% to 50% by controlling the temperature of a heater based on an estimated wafer temperature as calculated in the above-described manner. The present invention can thus be used effectively especially when there is a large difference between a detection temperature of a temperature sensor disposed in the apparatus and the actual temperature of an object to be processed, and can accurately and quickly control and increase the temperature of a silicon wafer in a low temperature range (100 to 400° C.) in which the absorption wavelength of the silicon wafer is short.

Though in this embodiment the space 4 is divided into the ten unit areas A1 to A10, the space 4 may be divided into any number of unit areas. Further, the division of the space 4 is not limited to equal division as in this embodiment. For example, it is possible to divide a furnace opening area, which is subject to a large temperature change, into narrower unit areas. It is possible to provide an additional temperature sensor in the cooling gas exhaust port or in an area around the heat-retaining section.

What is claimed is:

1. A heat treatment apparatus comprising:
    a processing container configured to process an object to be processed;
    a heating section, provided outside the processing container, configured to externally heat the processing container;
    a holding section configured to hold the object to be processed and to be carried into and out of the processing container;
    a holding section transport section configured to carry the holding section into and out of the processing container;
    a first temperature sensor, provided between the heating section and the processing container, configured to detect the temperature of the heating section;
    a second temperature sensor, fixed in the processing container, configured to detect the interior temperature of the processing container;
    a third temperature sensor to be carried into and out of the processing container along with the holding section;
    a control section for controlling a power to the heating section; and
    a temperature estimation section configured to select two of the first temperature sensor, the second temperature sensor and the third temperature sensor, and estimate the temperature of the object to be processed based on detection temperatures from the two temperature sensors,
    wherein the temperature estimation section determines the temperature T of the object to be processed according to the following formula:

$$T = T1 \times (1-\alpha) + T2 \times \alpha, \alpha > 1,$$

where T1 represents a detection temperature of one of the first temperature sensor, the second temperature sensor and the third temperature sensor, T2 represents a detection temperature of another one of the first temperature sensor, the second temperature sensor and the third temperature sensor, and α represents a mixing ratio.

2. A heat treatment method using a heat treatment apparatus comprising: a processing container configured to process an object to be processed; a heating section, provided outside the processing container, configured to externally heat the processing container; a holding section configured to hold the object to be processed and to be carried into and out of the processing container; a holding section transport section configured to carry the holding section into and out of the processing container; a first temperature sensor, provided between the heating section and the processing container, configured to detect the temperature of the heating section; a second temperature sensor, fixed in the processing container, configured to detect the interior temperature of the processing container; a third temperature sensor to be carried into and out of the processing container along with the holding section; a control section for controlling a power to the heating section; and a temperature estimation section configured to select two of the first temperature sensor, the second temperature sensor and the third temperature sensor, and estimate the temperature of the object to be processed based on detection temperatures from the two temperature sensors, said method comprising:
    loading an object to be processed into the holding section;

carrying the object to be processed, held in the holding section, into the processing container;

selecting in the temperature estimation section two of the first temperature sensor, the second temperature sensor and the third temperature sensor, and estimating the temperature of the object to be processed based on detection temperatures from the two temperature sensors; and controlling the power of the heating section based on the temperature of the object to be processed, estimated by the temperature estimation section, wherein the temperature estimation section determines the temperature T of the object to be processed according to the following formula:

$$T = T1 \times (1-\alpha) + T2 \times \alpha, \ \alpha > 1,$$

where T1 represents a detection temperature of one of the first temperature sensor, the second temperature sensor and the third temperature sensor, T2 represents a detection temperature of another one of the first temperature sensor, the second temperature sensor and the third temperature sensor, and α represents a mixing ratio.

* * * * *